(12) United States Patent
Yamaoka (10) Patent No.: US 6,442,026 B2
(45) Date of Patent: Aug. 27, 2002

(54) APPARATUS FOR COOLING A CIRCUIT COMPONENT

(75) Inventor: Yoji Yamaoka, Hino (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/732,915

(22) Filed: Dec. 11, 2000

(30) Foreign Application Priority Data

Dec. 13, 1999 (JP) .......................................... 11-353174

(51) Int. Cl.⁷ ................................................ H05K 7/20
(52) U.S. Cl. ...................... 361/704; 257/719; 361/710; 361/719; 439/487
(58) Field of Search ............................... 165/80.2, 80.3, 165/185; 174/16.3; 257/718–719, 726–727; 361/704, 707, 687, 705, 708, 710, 715, 717–720, 758; 439/485, 487

(56) References Cited

U.S. PATENT DOCUMENTS 5,784,256 A  * 7/1998 Nakamura et al. .......... 361/687
5,926,371 A  * 7/1999 Doldear ...................... 361/704

FOREIGN PATENT DOCUMENTS

JP     11-68360      3/1999
JP     2928236       8/1999

* cited by examiner

*Primary Examiner*—Gregory Thompson
(74) *Attorney, Agent, or Firm*—Finnegan, Henderson, Farabow, Garrett & Dunner, L.L.P.

(57) ABSTRACT

An apparatus for cooling circuit components includes a heat sink and circuit components mounted on a base. The heat sink includes a heat receiving portion for receiving heat from the circuit components. The heat sink includes a heat-transfer member provided between the heat sink and the circuit component. A spacer is provided between the circuit components and the heat sink to support the heat sink.

10 Claims, 7 Drawing Sheets

APPARATUS FOR COOLING A CIRCUIT COMPONENT

CROSS-REFERENCE TO RELATED APPLICATIONS

This application is based upon and claims the benefit of priority from the prior Japanese Patent Application No. 11-353174, filed Dec. 13, 1999, the entire contents of which are incorporated herein by reference.

BACKGROUND OF THE INVENTION

The present invention relates to a cooling unit for promoting heat radiation of circuit components that generate heat, such as a semiconductor package, and an electronic apparatus such as a personal computer comprising the cooling unit.

An electronic apparatus such as a desktop personal computer and a workstation comprises a semiconductor package for multi-purpose multimedia information such as characters, speech and images. In the semiconductor package of this kind, the power consumption is increased in accordance with the acceleration of the processing speed and the versatility, and in proportion to this the amount of heat in the operation is also inclined to rapidly increase.

For this reason, heat radiation of the semiconductor package needs to be enhanced to maintain the stable operation thereof. Therefore, various heat radiating/cooling means such as a heat sink or a heat pipe are indispensable.

A conventional heat sink has a heat receiving portion thermally connected to the semiconductor package. If there is a poor contact between the heat receiving portion and the semiconductor package, a gap occurs therebetween and thereby prevents transfer of the heat from the semiconductor package to the heat receiving portion. Thus, in the prior art, heat conductive grease or a rubber heat transfer sheet is provided between the heat receiving portion and the semiconductor package and the heat sink is pressed against the semiconductor package through a spring to enhance the close contact between the heat receiving portion and the semiconductor package.

Incidentally, if the heat receiving portion of the heat sink is forcibly pressed against the semiconductor package, load is applied to the semiconductor package through the heat receiving portion and may be the stress to the semiconductor package. In this case, there is no problem if the semiconductor package has strength enough to overcome the stress. Recently, however, the semiconductor package has been structurally simplified due to various requests such as reduction of the manufacturing costs, saving of the weight, miniaturization and the like. For this reason, some kinds of the semiconductor packages do not have the structural strength enough to bear the stress.

Specifically, in the ceramic package, which is a typical airtight sealing package, an IC chip generating heat is covered with a ceramic board or a ceramic lid having high rigidity. The load of the heat sink can be therefore received by the ceramic board or the ceramic lid.

On the other hand, in the BGA (Ball Grid Array) package and PGA (Pin Grid Array) package in which the IC chip is subjected to flip chip bonding on a synthetic resin circuit board, or the TCP (Tape Carrier Package) in which the IC chip is bonded to polyimide tape, the IC chip is exposed to the outside and the circuit board or tape supporting the IC chip is formed of synthetic resin. For this reason, it cannot be said that the package of this kind has the strength enough to bear the load from the heat sink.

Therefore, for example, if the heat receiving portion of the heat sink is pressed against the IC chip of the BGA package, the stress concentrates on the IC chip and the IC chip may be broken. In addition, as the IC chip receives the load caused by pressing the IC chip against the circuit board, the load acts as a bending force to the circuit board and the circuit board may be curved or bent backward. As a result, the stress is continuously applied to the connection portions of the IC chip and the circuit board, which may cause the faulty bonding.

Therefore, the heat sink cannot be pressed against the IC chip with a large force in the semiconductor package such as the BGA, PGA and the like. For this reason, it is difficult to sufficiently maintain the close contact between the heat sink and the semiconductor package, and efficient transfer of heat from the semiconductor package to the heat sink is prevented.

BRIEF SUMMARY OF THE INVENTION

The object of the present invention is to provide a cooling unit and circuit module capable of efficiently radiating the heat of the circuit component to the heat sink while reducing the stress applied to the circuit components, and also provide an electronic apparatus comprising the cooling unit.

In one embodiment of the invention, there is provided an apparatus comprising a wiring board having a surface; a circuit component containing a base of synthetic resin, said base having a first mounting surface, a second mounting surface positioned on an opposite side to the first mounting surface, a plurality of terminals arranged on said second mounting surface, and a heat generating unit positioned on a central part of the first mounting of said base, said plurality of terminals arranged in an area around said heat generating unit; a socket provided on the surface of said wiring board and electrically connected to said plurality of terminals, said socket having a hollow portion at a position corresponding to the central part of said base, said second mounting surface of said base facing the hollow portion of said socket; a heat sink on said circuit component, said heat sink having a heat receiving portion for receiving heat of said heat generating unit; a flexible heat-transfer member provided between said heat generating unit and said heat receiving portion, for thermally connecting said heat generating unit and said heat receiving portion; and a spacer provided between said base of said circuit component and said heat sink, for supporting said heat sink.

In another embodiment of the invention, there is provided an electronic apparatus comprising a housing; a wiring board contained inside said housing, said wiring board having a surface; a circuit component containing a base, said base having a first mounting surface, a second mounting surface positioned on an opposite side to the first mounting surface, a plurality of terminals arranged on said second mounting surface, said plurality of terminals, said socket having a hollow portion at a position corresponding to the central part of said base, said second mounting surface of said base facing the hollow portion of said socket; a heat sink on said circuit component, said heat sink having a heat receiving portion for receiving heat of said heat generating unit; a flexible heat-transfer member provided between said heat generating unit and said heat receiving portion, for thermally connecting said heat generating unit and said heat receiving portion to one another; a pushing member for pushing said heat sink toward said heat generating unit to sandwich said heat-transfer member between said heat generating unit and said heat receiving portion; and a spacer provided between said base of said circuit component and said heat sink, for supporting said heat sink.

In this structure, when the heat sink is thermally connected to the heat generating unit, the heat sink is pushed on the heat generating unit by the pushing means. At this time, as the spacer is provided between the heat sink and the base of the circuit component, most of the load of heat sink applied to the heat generating unit is received by the spacer. Thus, excessive stress is not concentrated on the heat generating unit and thereby bending or warping of the base supporting the heat generating unit can be prevented. For this reason, it is possible to prevent floating of the heat generating unit or damage of the mounting part of the heat generating unit.

In addition, the close contact between the heat generating unit and the heat receiving portion can be maintained by appropriately pushing down the flexible heat-transfer member between the heat receiving portion and the heat generating unit. Therefore, the thermal connection between the heat generating unit and the heat receiving portion can be stably maintained and the heat of the heat generating unit can be efficiently transferred to the heat sink.

To achieve the above-described object, there is also provided a cooling unit according to the present invention, for cooling a circuit component including base of synthetic resin having a mounting surface and a heat generating unit mounted on the mounting surface of the base. The cooling unit comprises a heat sink, which is overlapped on the circuit component and which has a heat receiving portion for receiving heat of the heat generating unit, a spacer, which is provided between the base and the heat sink and which constitutes a grease-filled chamber surrounding the heat generating unit in cooperation with the base and the heat sink, fixing means for fixing the heat sink on the base to allow the spacer to be sandwiched between the heat sink on the base, and heat-transfer grease packed in the grease-filled chamber to thermally connect the heat generating unit and the heat sink to one another.

In this structure, as the heat generating unit is embedded in the grease, the contact area of the heat generating unit and the grease and the contact area of the heat sink and the grease can be adequately maintained. Therefore, the heat of the heat generating unit can be efficiently transferred to the heat sink through the grease.

Moreover, if the heat sink is fixed on the base, the spacer is sandwiched between the heat sink and the base. Thus, the heat generating unit is not directly pushed down by the heat sink or no stress is not applied to the heat generating unit. In addition, the load of the heat sink applied to the base when the heat sink is fixed is dispersed in a wide range around the heat generating unit via the spacer, and the excessive stress cannot be concentrated on a specific part of the base. Therefore, it is possible to prevent the bending or warping of the base supporting the heat generating unit, and also possible to prevent the floating of the heat generating unit or damage of the mounting part of the heat generating unit.

To achieve the above-described object, there is also provided a circuit module according to the present invention, comprising a wiring board, a semiconductor package containing a circuit board of synthetic resin, which has a mounting surface and a plurality of current-carrying terminals on a opposite side to the mounting surface, and an IC chip, which is mounted on the mounting surface of the circuit board and generates heat, the current-carrying terminals being electrically connected to the wiring board, a heat sink, which is overlapped on the semiconductor package and which has a heat receiving portion for receiving heat of the IC chip, a flexible heat-transfer member provided between the IC chip and the heat receiving portion, for thermally connecting the IC chip and the heat receiving portion to one another, pushing means for pushing the heat sink toward the IC chip to sandwich the heat-transfer member between the IC chip and the heat receiving portion, and a spacer provided between the circuit board of the semiconductor package and the heat sink, for supporting the heat sink, at a position remote from the IC chip.

In this structure, when the heat sink is thermally connected to the IC chip of the semiconductor package, the heat sink is pushed on the IC chip by the pushing means. At this time, as the spacer is provided between the heat sink and the circuit board of the semiconductor package, most of the load of heat sink applied to the IC chip is received by the spacer. Thus, excessive stress is not concentrated on the IC chip and thereby the bending or warping of the circuit board supporting the IC chip can be prevented. For this reason, it is possible to prevent the floating of the IC chip or the damage of the mounting part of the IC chip.

Further, the load applied to the circuit board through the spacer is transferred to the wiring board via a plurality of current-carrying terminals. Therefore, the load on each of the current-carrying terminals can be reduced, deformation or breakage of the current-carrying terminals can be prevented, and the damage of the connecting part between the current-carrying terminals and the wiring board can also be prevented.

In addition, the close contact between the IC chip and the heat receiving portion can be maintained by appropriately pushing down the flexible heat-transfer member between the IC chip and the heat receiving portion. Therefore, the thermal connection between the IC chip and the heat receiving portion can be stably maintained and the heat of the IC chip can be efficiently transferred to the heat sink.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The desktop personal computer according to the first embodiment of the present invention will be explained below with reference to FIGS. 1 to 5.

Figure 1:
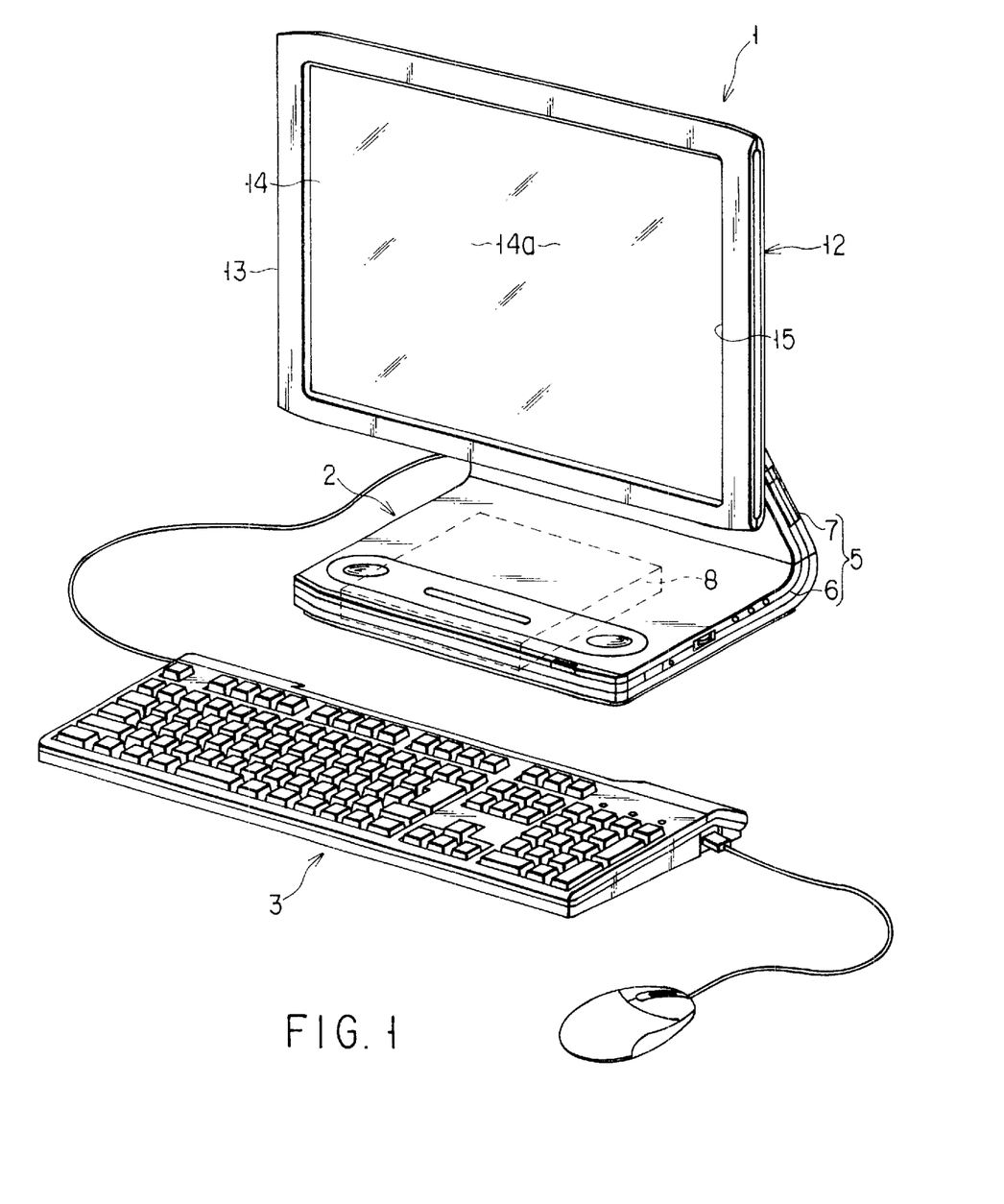
FIG. 1 is a perspective view showing a desktop personal computer according to a first embodiment of the present invention.

FIG. 1 shows a desktop personal computer 1 as an electronic apparatus. The computer 1 comprises a main body 2, and a keyboard 3 connected to the main body 2.

The main body 2 has a housing 5 formed of synthetic resin. The housing 5 is composed of a base portion 6 and a stand portion 7. The base portion 6 is shaped in a flat square casing and contains a CD-ROM drive 8 or a floppy disk drive (not shown) so that it can be removed from the base portion 6.

Figure 2:
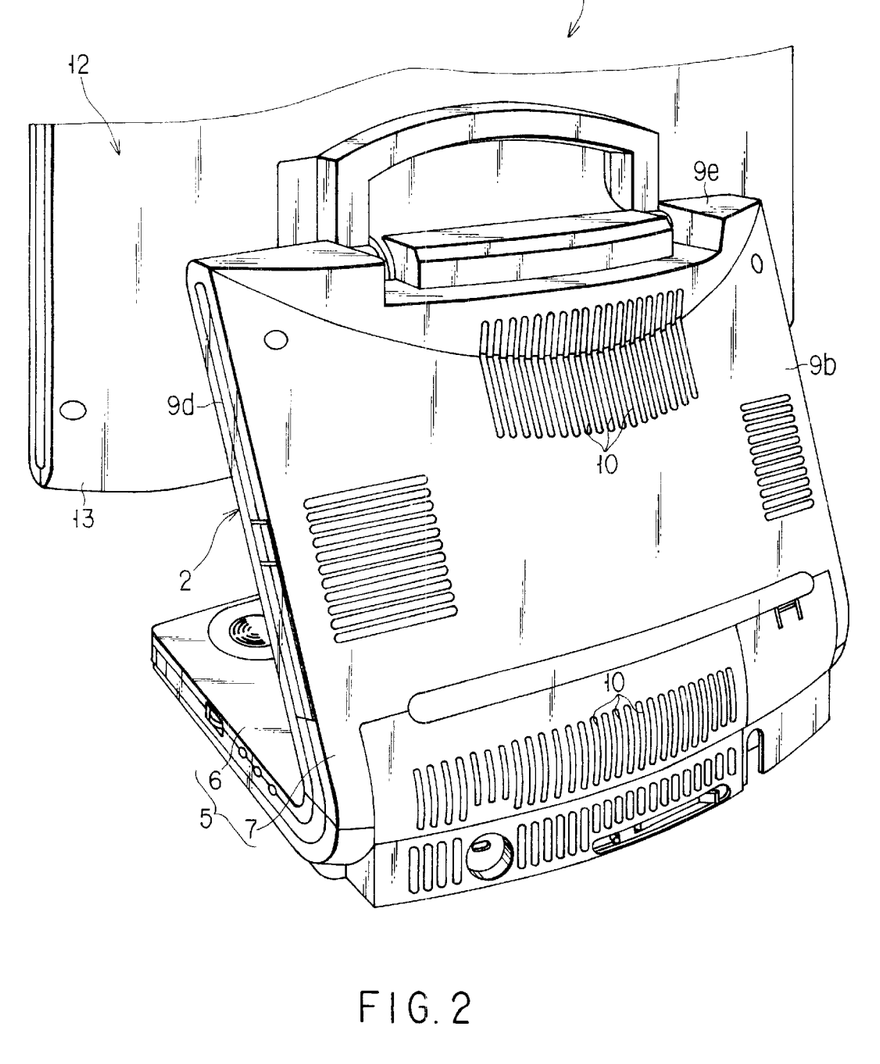
FIG. 2 is a perspective view showing a desktop personal computer according to the first embodiment of the present invention as seen from the back of the main body.

The stand portion 7 extends upwardly from a rear end of the base portion 6. The stand portion 7 is shaped in a hollow casing having a front wall 9a, a rear wall 9b, right and left side walls 9c and 9d, and a top wall 9e. A plurality of air vents 10 are formed on the rear wall 9b.

A flat liquid-crystal display unit 12 is supported at a top end of the stand portion 7. The display unit 12 comprises a display housing 13 and a liquid-crystal display panel 14 contained in the display housing 13. The display housing 13 has a front face on which an opening portion 15 is formed. A display screen 14a of the display panel 14 is exposed to the outside through the opening portion 15.

Figure 3:
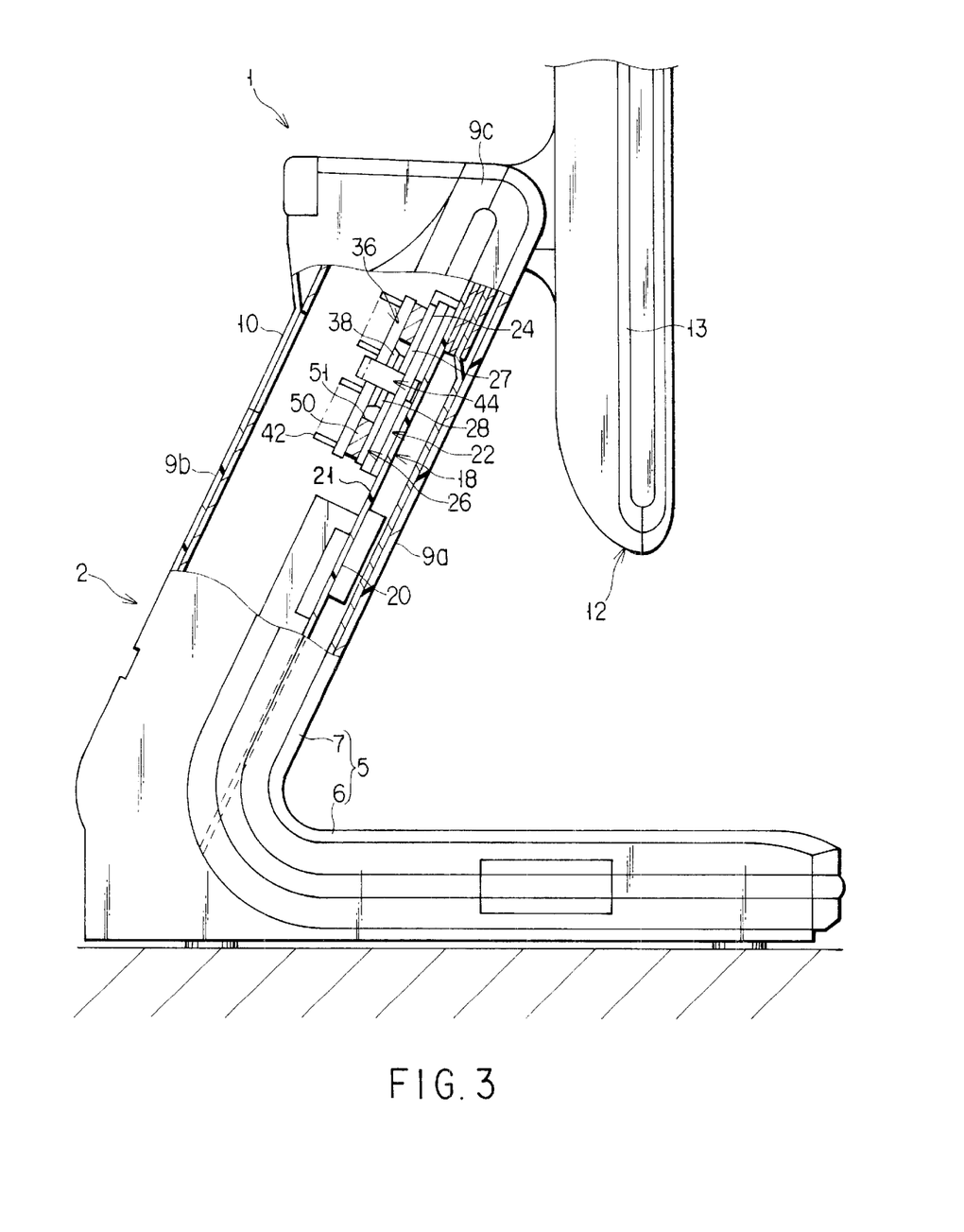
FIG. 3 is a side view showing a desktop personal computer according to the first embodiment of the present invention, illustrating a partial section of a housing of the main body.

A circuit module 18 is contained in the stand portion 7 as shown in FIG. 3. The circuit module 18 comprises a printed wiring board 20 and also a PGA semiconductor package 26, which is a circuit component. The printed wiring board 20 is arranged along the front wall 9a of the stand portion 7. The printed wiring board 20 has a component-mounted surface 21. The component-mounted surface 21 faces the rear wall 9b. A CPU socket 22 is mounted on the component-mounted surface 21.

Figure 4:
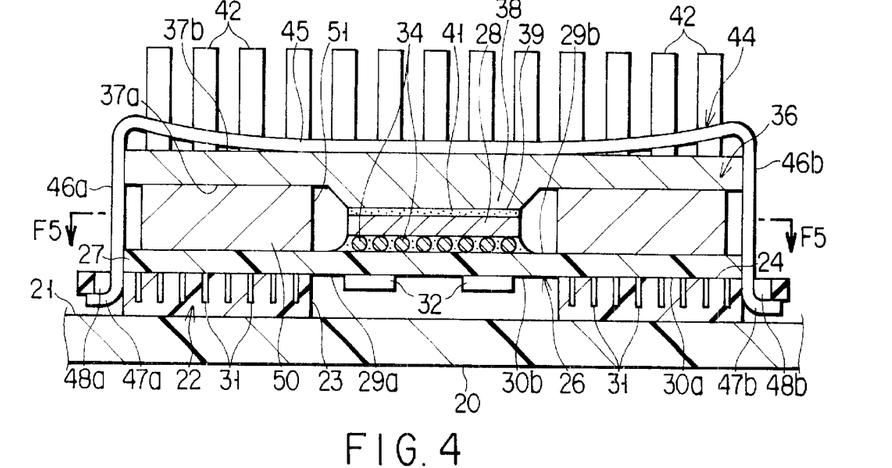
FIG. 4 is a sectional view showing a state of attaching a heat sink to a PGA semiconductor package mounted on a printed wiring board, in the first embodiment of the present invention.

The CPU socket 22 is a square frame having a hollow portion 23 at the center as shown in FIG. 4. The CPU socket 22 has a CPU support surface 24 on the opposite side to the printed wiring board 20. A plurality of terminal holes (not shown) are arranged in a matrix on the CPU support surface 24. The terminal holes are electrically connected to pads (not shown) on the component-mounted surface 21.

The PGA semiconductor package 26 is supported on the printed wiring board 20 via the CPU socket 22. The semiconductor package 26 comprises a circuit board 27 of synthetic resin, which serves as a base, and an IC chip 28, which is a heat generating unit.

The circuit board 27 has a first mounting surface 29a and a second mounting surface 29b. The second mounting surface 29b is on the opposite side to the first mounting surface 29a. The first mounting surface 29a of the circuit board 27 includes a pin-arranged area 30a and a component-arranged area 30b. The pin-arranged area 30a corresponds to the CPU support surface 24 of the CPU socket 22 and is positioned on an outer peripheral portion of the first mounting surface 29a. The component-arranged area 30b corresponds to the hollow portion 23 of the CPU socket 22 and is positioned at the center of the first mounting surface 29a. For this reason, the component-arranged area 30b is surrounded with the pin-arranged area 30a.

A plurality of pin-like current-carrying terminals 31 are arranged in the pin-arranged area 30a of the circuit board 27 as shown in FIG. 4. The current-carrying terminals 31 are arranged in a matrix to correspond to the terminal holes of the CPU socket 22 and are formed to protrude downwardly from the pin-arranged area 30a of the circuit board 27. A plurality of other circuit components 32, for example, capacitors are mounted in the component-arranged area 30b of the circuit board 27.

The IC chip 28 of the semiconductor package 26 consumes large power during the operation since it processes the multi-purpose multimedia information such as characters, speech and images at a high speed. In accordance with this, the amount of heat from the IC chip 28 becomes large such that the IC chip 28 needs to be cooled. The IC chip 28 is subjected to flip-chip bonding on the second mounting surface 29b of the circuit board 27 via a plurality of solder balls 34. The IC chip 28 is arranged at the center of the second mounting surface 29b and positioned on the opposite side to the component-arranged area 30b. For this reason, the current-carrying terminals 31 are arranged in an area except the position corresponding to the IC chip 28, on the first mounting surface 29a.

In the semiconductor package 26, when a lock lever (not shown) of the CPU socket 22 is operated after inserting the current-carrying terminals 31 into the terminal holes of the CPU socket 22, the current-carrying terminals 31 are locked such that they cannot be detached from the CPU socket 22. Thus, the fitting of the current-carrying terminals 31 to the terminal holes is maintained and the semiconductor package 26 is electrically connected to the printed wiring board 20. When the semiconductor package 26 is mounted on the CPU socket 22, heating IC chip 28 is positioned just above the hollow portion 23 of the CPU socket 22 and the circuit components 32 are contained in the hollow portion 23.

A heat sink 36 overlaps the semiconductor package 26 as shown in FIG. 4. The heat sink 36 is formed of a metal material excellent in heat conductivity, for example, an aluminum alloy. The heat sink 36 is shaped in a flat plate that is slightly larger than the plane shape of the semiconductor package 26.

The heat sink 36 has a first surface 37a and a second surface 37b positioned on the opposite side to the first surface 37a. The first surface 37a faces the semiconductor package 26. A heat receiving portion 38 for receiving the heat from the IC chip 28 is formed integrally with a central part of the first surface 37a. The heat receiving portion 38 protrudes from the central part of the first surface 37a. The protruding end of the heat receiving portion 38 is a flat heat receiving surface 39. The heat receiving surface 39 has substantially the same size as that of the upper surface of the IC chip 28 and faces the IC chip 28. A flexible heat-transfer member 41 is provided between the heat receiving surface 39 and the IC chip 28. The heat-transfer member 41 is formed of heat-transfer grease or a heat-transfer sheet of a rubber-like elastic material.

A plurality of pin-shaped radiator fins 42 are formed integrally with the second surface 37b of the heat sink 36. The radiator fins 42 are arranged in a matrix on the second surface 37b.

The heat sink 36 is fixed on the CPU socket 22 via a fixing spring 44 serving as pressurizing means so as to be detached therefrom. The fixing spring 44 has a strip-shaped pressurizing portion 45 and a pair of arm portions 46a and 46b connected to both ends of the pressurizing portion 45. The pressurizing portion 45 extends across the central part of the second surface 37b of the heat sink 36 and is curved in a shape of an arc so as to warp to the second surface 37b. For this reason, the central part in the longitudinal direction of the pressurizing portion 45 elastically touches the second surface 37b. The arm portions 46a and 46b are formed by turning up both ends of the pressurizing portion 45 at substantially right angles in the same direction. Engaging portions 47a and 47b are formed respectively at the top ends of the arm portions 46a and 46b. The engaging portions 47a and 47b are hooked in the engagement holes 48a and 48b of the CPU socket 22 so as to be detached therefrom.

For this reason, when the engaging portions 47a and 47b of the fixing spring 44 are hooked in the engagement holes 48a and 48b of the CPU socket 22, the pressurizing portion 45 of the fixing spring 44 elastically abuts on the second surface 37b of the heat sink 36 and thereby the heat sink 36 is pushed toward the semiconductor package 26. Thus, the heat-transfer member 41 is sandwiched between the IC chip 28 and the heat receiving surface 39 of the heat sink 36, so that the IC chip 28 and the heat receiving surface 39 are thermally connected via the heat-transfer member 41.

Figure 5:
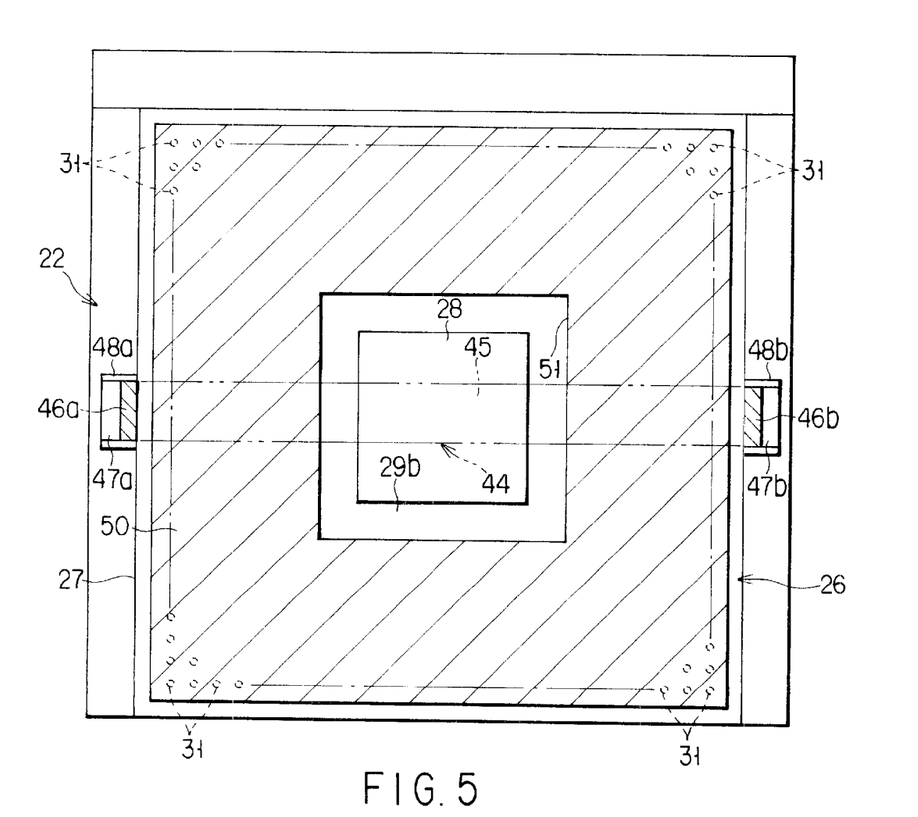
FIG. 5 is a sectional view as seen along a line F5—F5 of FIG. 4.

A spacer 50 is provided between the circuit board 27 of the semiconductor package 26 and the heat sink 36 as shown in FIGS. 4 and 5. The spacer 50 formed of a rigid material such as synthetic resin, metal or ceramic. The spacer 50 is shaped in a square frame to surround the IC chip 28 and the heat receiving portion 38 of the heat sink 36, and a through hole 51 is formed at the central part of the spacer 50 while avoiding the IC chip 28 and the heat receiving portion 38.

The spacer 50 has a thickness extremely greater than the height of the IC chip 28. When the heat sink 36 is fixed at the CPU socket 22 by the fixing spring 44, the spacer 50 is sandwiched between the outer 1peripheral part of the first surface 37a of the heat sink 36 and the second mounting surface 29b of the circuit board 27 and is positioned just above the CPU socket 22 and the current-carrying terminals 31.

Thus, the spacer 50 supports the heat sink 36 at the position remote from the IC chip 28 and receives most of the load of the heat sink 36 applied to the IC chip 28. Therefore, the heat-transfer member 41 is pushed down between the IC chip 28 and the heat receiving surface 39 to an appropriate degree by appropriately setting the thickness of the spacer 50 in accordance with the height of the IC chip 28, the degree of the protrusion of the heat receiving portion 38 and the like. As a result, the heat-transfer member 41 is packed at high density without gap between the IC chip 28 and the heat receiving surface 39.

In this structure, when the IC chip 28 of the semiconductor package 26 generates heat, the heat of the IC chip 28 is transferred to the heat receiving portion 38 of the heat sink 36 through the heat-transfer member 41. Then, the heat of the IC chip 28 is diffused to the heat sink 36 by the transfer of heat from the heat receiving portion 38 to the heat sink 36 and radiated into the stand portion 7 via the radiator fins 42.

The heat sink 36 is forcibly pushed down on the semiconductor package 26 via the fixing spring 44, in the state of thermally connecting the heat sink 36 to IC chip 28, as shown in greatest detail in FIG. 4. At this time, as the spacer 50 surrounding the IC chip 28 is provided between the semiconductor package 26 and heat sink 36 and the heat sink 36 is supported by the spacer 50, most of the load of the heat receiving portion 38 of the heat sink 36 applied to the IC chip 28 is received by the spacer 50.

For this reason, the excessive load of the heat receiving portion 38 of the heat sink 36 is not concentrated on the IC chip 28 and therefore it is possible to prevent the IC chip 28 from being damaged. In addition, it is possible to prevent the central part of the circuit board 27 supporting the IC chip 28 from bending or warping, the soldering part between the circuit board 27 and the solder balls 34 is not peeled, or no cracks occur at the solder part. Electric connection between the circuit board 27 and the IC chip 28 can be therefore maintained preferably.

In addition, as the central part of the circuit board 27 corresponds to the component-arranged area 30b on the circuit board 27, bending or warping of the component-arranged area 30b can be prevented. For this reason, it is possible to prevent the connected part between the component-arranged area 30b and the circuit components 32 from being peeled off or damaged, and it is also possible to remarkably maintain the reliability on the electric connection between the circuit board 27 and the circuit components 32.

Further, as the spacer 50 abuts on the second mounting surface 29b of the circuit board 27, at the position corresponding to the CPU socket 22, the load of the spacer 50 applied to the circuit board 27 can be received by taking advantage of the CPU socket 22. For this reason, the circuit board 27 is deformed more hardly and, therefore, it is possible to certainly prevent the soldering part between the circuit board 27 and the IC chip 28 from being peeled off or damaged.

Moreover, the close contact between the IC chip 28 and the heat receiving portion 38 of the heat sink 36 can be maintained by appropriately pushing down the flexible heat-transfer member 41 and packing it between the IC chip 28 and the heat receiving portion 38 at high density. Therefore, it is possible to increase the reliability on the electric connection between the IC chip 28 and the circuit board 27 while maintaining the stable heat connection state between the IC chip 28 and the heat sink 36.

Figure 6:
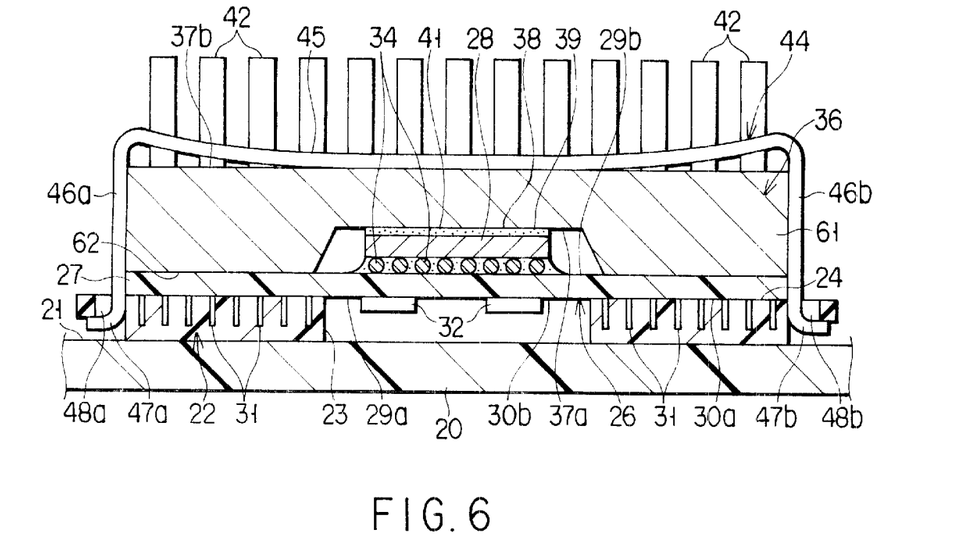
FIG. 6 is a sectional view showing a state of attaching a heat sink to a PGA semiconductor package mounted on a printed wiring board, in a second embodiment of the present invention.

The present invention is not limited to the above-described first embodiment. FIG. 6 shows a second embodiment of the present invention.

In the second embodiment, the structure of the heat sink 36 is different from that in the first embodiment, but the structures of the CPU socket 22 and the semiconductor package 26 are the same as those in the first embodiment. For this reason, the same constituent elements as those in the first embodiment are denoted by the same reference numerals in the second embodiment, and their explanations will be omitted.

The heat sink 36 has a protruding portion 61 formed integrally with the heat sink 36 as shown in FIG. 6. The protruding portion 61 protrudes from the outer peripheral part of the first surface 37a toward the second mounting surface 29b of the circuit board 27 and is shaped in a frame surrounding the heat receiving surface 39 of the heat sink 36. The height of protrusion of the protruding portion 61 is set to be larger than the height of the IC chip 28.

The protruding portion 61 has a flat contact surface 62 at its protruding end. The contact surface 62 is in contact with the second mounting surface 29b of the circuit board 27 in the outer periphery of the IC chip 28 when the heat sink 36 is fixed at the CPU socket 22. Thus, the protruding portion 61 functions as a spacer in the second embodiment.

In this structure, the heat sink 36 overlaps the semiconductor package 26 and the protruding portion 61 of the heat sink 36 contacts the second mounting surface 29b of the circuit board 27. For this reason, when the heat sink 36 is fixed at the CPU socket 22 via the fixing spring 44, most of the load of the heat receiving portion 38 of the heat sink 36 applied to the IC chip 28 can be received by the protruding portion 61 and, therefore, excessive stress is not concentrated on the IC chip 28.

Further, as the work for providing a spacer between the heat sink 36 and the circuit board 27 is unnecessary, the steps of the working process can be reduced and the fixation of the heat sink 36 can be easily executed. In addition, as the protruding portion 61 of the heat sink 36 also serves as a spacer, the number of components can be decreased and the manufacturing costs can be reduced as compared with a case where the spacer is separated from the heat sink 36.

Moreover, as the protruding portion 61 is a part of the heat sink 36 in the above structure, the protruding portion 61 itself has heat conductivity. Thus, the heat radiated from the IC chip 28 to the circuit board 27 can be transferred to the heat sink 36 through the protruding portion 61. Therefore, the heat radiation path from the IC chip 28 to the heat sink 36 is constituted by a route passing through the heat receiving portion 38 and a route passing from the circuit board 27 through the protruding portion 61, and the heat radiating ability of the IC chip 28 can be enhanced.

Figure 7:
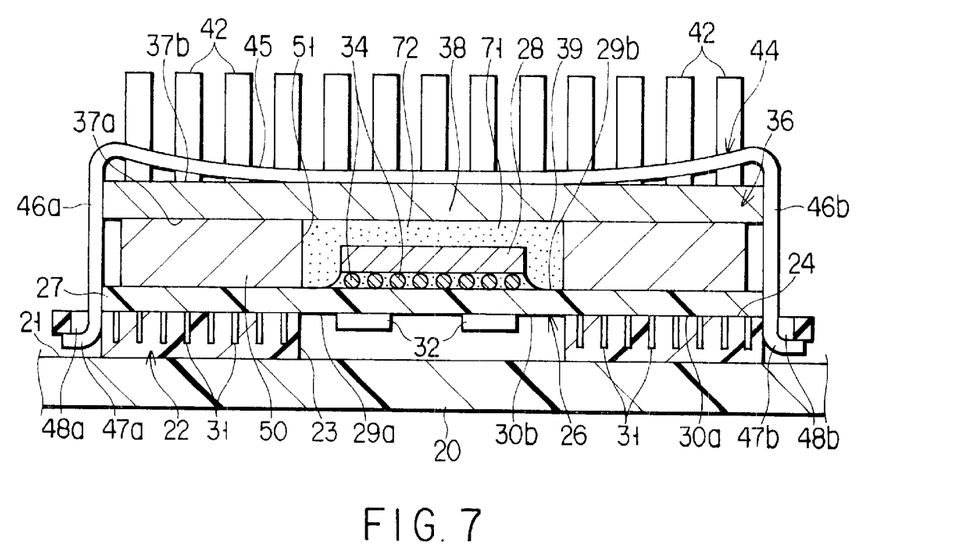
FIG. 7 is a sectional view showing a state of attaching a heat sink to a PGA semiconductor package mounted on a printed wiring board, in a third embodiment of the present invention.

FIG. 7 shows a third embodiment of the present invention. In the third embodiment, the structure of the heat radiation path from the IC chip 28 to the heat sink 36 is different from that in the first embodiment, and other constituent elements are the same as those of the first embodiment.

As shown in FIG. 7, the spacer 50 sandwiched between the heat sink 36 and the second mounting surface 29b of the circuit board 27 constitutes a grease-filled chamber 71 in cooperation with the heat receiving surface 39 of the heat sink 36 and the second mounting surface 29b of the circuit board 27. The IC chip 28 of the semiconductor package 26 is contained in the grease-filled chamber 71. Grease 72 having heat conductivity is packed at high density in the grease-filled chamber 71. The grease 72 is in contact with the IC chip 28, the heat receiving surface 39 of the heat sink 36, the inner surface of the through hole 51 of the spacer 50, and the second mounting surface 29b of the circuit board 27. Therefore, the IC chip 28 is embedded in the grease 72 so that the contact area of the IC chip 28 and the grease 72 and the contact area of the grease 72 and the heat sink 36 are adequately maintained.

In this structure, the heat of the IC chip 28 can be efficiently transferred to the heat sink 36 through the grease 72 and heat radiating ability of the IC chip 28 can be enhanced. Moreover, as the grease 72 is also in contact with the inner surface of the through hole 51 of the spacer 50, the heat of the IC chip 28 can be transferred to the heat sink 36 through the spacer 50. For this reason, particularly, if the spacer 50 is formed of a material excellent in the heat conductivity, the spacer 50 can be positively employed as a part of the heat radiation path and thereby the heat radiating ability of the IC chip 28 can be enhanced.

Figure 8:
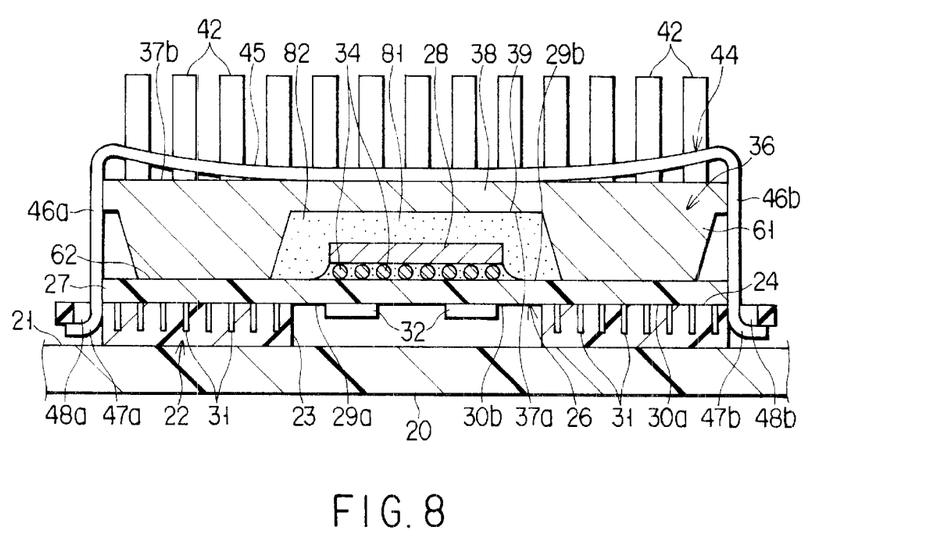
FIG. 8 is a sectional view showing a state of attaching a heat sink to a PGA semiconductor package mounted on a printed wiring board, in a fourth embodiment of the present invention.

FIG. 8 shows a fourth embodiment of the present invention. The fourth embodiment is similar to the second embodiment shown in FIG. 6, but is different therefrom with respect to the structure of the heat transfer path from the IC chip 28 to the heat sink 36.

As shown in FIG. 8, the height of the protruding portion 61 of the heat sink 36 is set to be remarkably larger than the height of the IC chip 28. The protruding portion 61 constitutes a grease-filled chamber 81 in cooperation with the heat receiving surface 39 of the heat sink 36 and the second mounting surface 29b of the circuit board 27. The IC chip 28 of the semiconductor package 26 is contained in the grease-filled chamber 81. Grease 82 having heat conductivity is packed at high density in the grease-filled chamber 81. The grease 82 is in contact with the IC chip 28, the heat receiving surface 39 of the heat sink 36, the inner surface of the protruding portion 61, and the second mounting surface 29b of the circuit board 27. Therefore, the IC chip 28 is embedded in the grease 82 so that the contact area of the IC chip 28 and the grease 82 and the contact area of the grease 82 and the heat sink 36 are adequately maintained.

In this structure, the grease 82 is packed not only between the upper face of the IC chip 28 and the heat receiving surface 39, but also between the side face of the IC chip 28 and the inner surface of the protruding portion 61. For this reason, the heat of the IC chip 28 can be efficiently transferred to the heat sink 36 through the grease 82 and heat radiating ability of the IC chip 28 can be enhanced.

Figure 9:
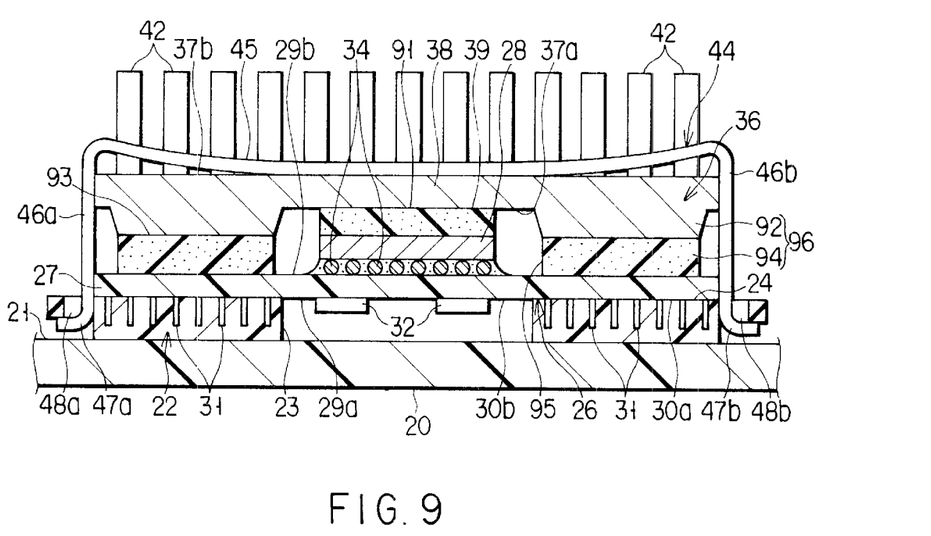
FIG. 9 is a sectional view showing a state of attaching a heat sink to a PGA semiconductor package mounted on a printed wiring board, in a fifth embodiment of the present invention.

FIG. 9 shows a fifth embodiment of the present invention. The fifth embodiment is different from the first embodiment with respect to the structure of the heat radiation path to transfer the heat of the IC chip 28 to the heat sink 36.

As shown in FIG. 9, a first heat-transfer sheet 91 serving as a heat-transfer member is provided between the heat receiving surface 39 of the heat sink 36 and the upper face of the IC chip 28. The first heat-transfer sheet 91 is formed of a rubber-like elastic material having the heat conductivity.

The heat sink 36 has a protruding portion 92 formed integrally with the heat sink 36. The protruding portion 92 protrudes from the outer peripheral part of the first surface 37a toward the second mounting surface 29b of the circuit board 27 and is shaped in a frame surrounding the heat receiving surface 39. The protruding portion 92 has a flat contact surface 93 on its protruding end. When the heat sink 36 is fixed at the CPU socket 22, the contact surface 93 faces the second mounting surface 29b of the circuit board 27 in the outer periphery of the IC chip 28.

A second heat-transfer sheet 94 is provided between the contact surface 93 of the protruding portion 92 and the second mounting surface 29b of the circuit board 27. The second heat-transfer sheet 94 is formed of a rubber-like elastic material having the heat conductivity. The second heat-transfer sheet 94 has a through hole 95 that avoids the IC chip 28 at its central part. When the heat sink 36 is fixed at the CPU socket 22, the second heat-transfer sheet 94 is sandwiched between the contact surface 93 of the protruding portion 92 and the second mounting surface 29b of the circuit board 27.

Thus, the protruding portion 92 and the second heat-transfer sheet 94 function as a spacer 96 for supporting the heat sink 36 in this embodiment. The load of the heat sink 36 applied to the IC chip 28 is received by the spacer 96.

In this structure, as the spacer 96 supporting the heat sink 36 has the heat conductivity, the heat radiated from the IC chip 28 to the circuit board 27 can be transferred to the heat sink 36 through the spacer 96. Thus, the heat radiation path of the IC chip 28 is constituted by a route passing from the first heat-transfer sheet 91 through the heat receiving portion 38 and a route passing from the circuit board 27 through the spacer 96. Therefore, the routes for heat radiation from the IC chip 28 to the heat sink 36 can be increased and the heat radiating ability of the IC chip 28 can be enhanced.

Figure 10:
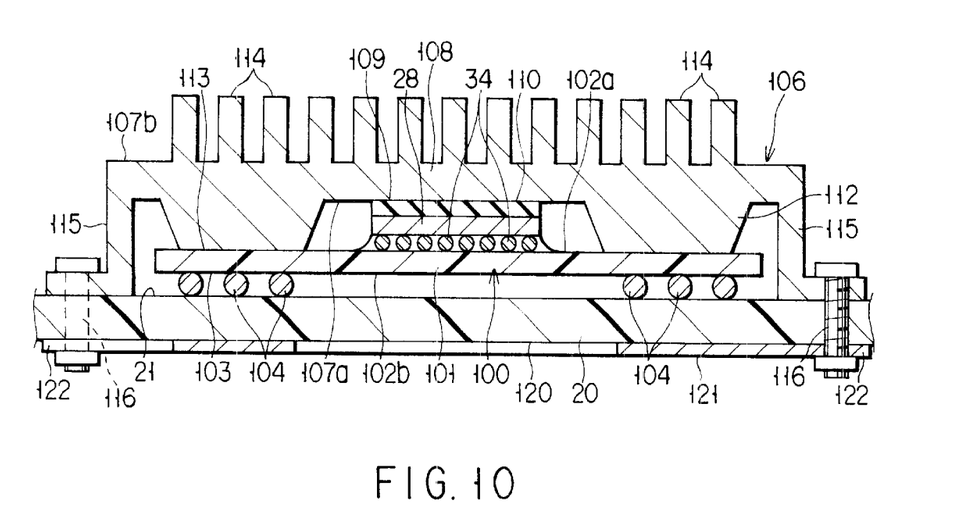
FIG. 10 is a sectional view showing a state of attaching a heat sink to a PGA semiconductor package mounted on a printed wiring board, in a sixth embodiment of the present invention.
Figure 11:
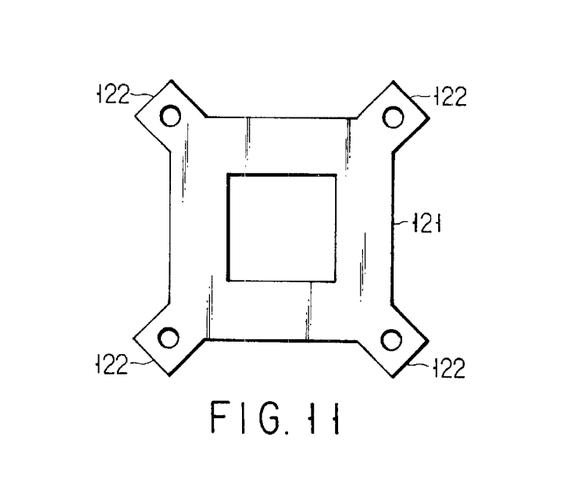
FIG. 11 is a plan view showing a reinforcement plate for reinforcing the printed wiring board, in the sixth embodiment of the present invention.

FIGS. 10 and 11 show a sixth embodiment of the present invention.

A BGA semiconductor package 100 is employed as a circuit component in the sixth embodiment.

As shown in FIG. 10, the semiconductor package 100 comprises a circuit board 101 of synthetic resin, which serves as a base, and the IC chip 28, which radiates heat. The circuit board 101 has a first mounting surface 102a and a second mounting surface 102b positioned on the opposite side to the first mounting surface 102a. The IC chip 28 is subjected to the flip-flop bonding at the central part of the first mounting surface 102a of the circuit board 101 via a plurality of solder balls 34. The second mounting surface 102b of the circuit board 101 has a ball arrangement region 103. The ball arrangement region 103 is positioned at the outer peripheral part of the second mounting surface 102b remote from the central part thereof. A plurality of solder balls 104, which serve as current-carrying terminals, are arranged in a matrix and soldered in the ball arrangement region 103. Thus, the solder balls 104 are arranged in an area except that just below the IC chip 28.

The semiconductor package 100 is mounted on the printed wiring board 20 by soldering the solder balls 104 on pads (not shown) on the component-mounted surface 21 of the printed wiring board 20.

A heat sink 106 for promoting the heat radiation of the semiconductor package 100 is provided on the component-mounted surface 21 of the printed wiring board 20. The heat sink 106 is formed of, for example, a metal material such as an aluminum alloy having excellent heat conductivity. The heat sink 106 is shaped in a flat plate slightly larger than the plane of the semiconductor package 100.

The heat sink 106 has a first surface 107a and a second surface 107b positioned on the opposite side to the first surface 107a. The first surface 107a faces the semiconductor package 100. The central part of the first surface 107a functions as a heat receiving portion 108 for receiving the heat of the IC chip 28. The heat receiving portion 108 has a heat receiving surface 109 positioned in the same plane as the first surface 107a. A heat-transfer sheet 110 serving as a heat-transfer member is provided between the heat receiving surface 109 and the upper face of the IC chip 28. The heat-transfer sheet 110 is formed of a rubber-like elastic material having the heat conductivity.

The heat sink 106 integrally has a protruding portion 112. The protruding portion 112 protrudes from the outer peripheral part of the first surface 107a except the heat receiving surface 109 toward the second mounting surface 102b of the circuit board 101 and is shaped in a frame surrounding the heat receiving surface 109. The height of protrusion of the protruding portion 112 is set to be greater than the height of the IC chip 28.

The protruding portion 112 has a flat contact surface 113 at its protruding end. The contact surface 113 is in contact with the first mounting surface 102a of the circuit board 101 in the outer periphery of the IC chip 28. The contact part between the contact surface 113 and the first mounting surface 102a is positioned just above the solder balls 104. Thus, the protruding portion 112 functions as a spacer in the sixth embodiment.

A plurality of radiator fins 114 are integrally formed on second surface 107b of the heat sink 106.

The heat sink 106 has a plurality of support legs 115. The support legs 115 are positioned at corner parts of the heat sink 106 so as to protrude from the corner parts toward the printed wiring board 20. Distal ends of the support legs 115 are fixed on the component-mounted surface 21 of the printed wiring board 20 by screws 116.

For this reason, if the support legs 115 are fixed on the printed wiring board 20, the heat sink 106 is pushed toward the semiconductor package 100. Thus, the heat-transfer sheet 110 is sandwiched between the heat receiving surface 109 of the heat sink 106 and the upper face of the IC chip 28, so that the heat receiving surface 109 and the IC chip 28 are thermally connected through the heat-transfer sheet 110. At the same time, the contact surface 113 at the protruding end of the protruding portion 112 abuts on the first mounting surface 102a of the circuit board 101, so that the protruding portion 112 receives most of the load of the heat sink 106 applied to the IC chip 28.

Therefore, the screws 116 function as pressurizing means for pushing down the heat sink 106 on the semiconductor package 100, in the present embodiment.

A metal reinforcement plate 121 as shown in FIG. 11 is attached to a back surface 120 on the opposite side to the component-mounted surface 21 of the printed wiring board 20. The reinforcement plate 121 is shaped in a square frame extending along the outer peripheral part of the heat sink 106. Tongues 122 are integrally formed at four corners of the reinforcement plate 121, respectively. The tongues 122 are fixed on the printed wiring board 20 via the screws 116.

For this reason, the reinforcement plate 121 is positioned opposite to the semiconductor package 100 and the heat sink 106 about the printed wiring board 20, so as to prevent the bending or warping of the printed wiring board 20 caused by pushing down the heat sink 106 toward the semiconductor package 100.

In this structure, the heat sink 106 receives the load of being pushed down on the semiconductor package 100 in accordance with the fastening of the screws 116, in the state that the heat sink 106 is thermally connected to the IC chip 28 of the semiconductor package 100. At this time, the heat sink 106 has the protruding portion 112 that functions as a spacer and the contact surface 113 at the protruding end of the protruding portion 112 is in contact with the first mounting surface 102a of the circuit board 101. Therefore, the heat sink 106 can be supported by the protruding portion 112 and most of the load of the heat sink 106 applied to the IC chip 28 can be received by the protruding portion 112.

As a result, excessive stress is not concentrated on the IC chip 28, and it is possible to prevent the bending or warping of the central part of the circuit board 101. Thus, the soldering part between the circuit board 101 and the solder balls 34 is not peeled off, crack does not occur at the soldering part, or the electric connection between the IC chip 28 and the circuit board 101 can be preferably maintained.

As the protruding portion 112 is in contact with the first mounting surface 102a of the circuit board 101, at the position corresponding to the solder balls 104, the load of the protruding portion 112 applied to the circuit board 101 can be received by a plurality of solder balls 104. Thus, the circuit board 101 is hardly deformed and, of course, the load on each of the solder balls 104 can be reduced. Therefore, it is possible to prevent the solder balls 104 from being deformed or damaged, and also possible to the soldering part between the solder balls 104 and the printed wiring board 20 from being peeled off or damaged.

Moreover, in the above-described structure, the close contact between the IC chip 28 and the heat receiving portion 108 of the heat sink 106 can be maintained as the elastic heat-transfer sheet 110 is pushed down to some extent and is packed between the IC chip 28 and the heat receiving portion 108 at high density. It is therefore possible to increase the reliability on the electric connection between the IC chip 28 and the circuit board 101 and between the semiconductor package 100 and the printed wiring board 20, while maintaining the stable heat connection state between IC chip 28 and the heat sink 106.

In the sixth embodiment, the solder balls are arranged in the area avoiding the IC chip. However, the solder balls may be arranged over the entire first mounting surface of the circuit board and may also be provided just beyond the IC chip.

In this structure, as the central part of the circuit board is supported by the solder balls, deformation at the central part of the circuit board can be certainly prevented. In addition, the load on each of the solder balls can be reduced to be smaller and thereby the reliability on the electric connection between the solder balls and the circuit board or the printed wiring board can be more increased.

Moreover, the present invention is not limited to the cooling of the PGA or BGA semiconductor package, but can be applied to a TCP (Tape Carrier Package) type semiconductor package obtained by bonding the IC chip on, for example, a polyimide tape used as a base.

Further, the electronic apparatus according to the present invention is not limited to a desktop personal computer, but can also be applied to a notebook-size portable computer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus comprising:
  a wiring board having a surface;
  a circuit component containing a base of synthetic resin, said base having a first mounting surface, a second mounting surface positioned on an opposite side to the first mounting surface, a plurality of terminals arranged on said second mounting surface, and a heat generating unit positioned on a central part of the first mounting surface of said base, said plurality of terminals arranged in an area around said heat generating unit;
  a socket provided on the surface of said wiring board and electrically connected to said plurality of terminals, said socket having a hollow portion at a position corresponding to the central part of said base, said second mounting surface of said base facing the hollow portion of said socket;
  a heat sink on said circuit component, said heat sink having a heat receiving portion for receiving heat from said heat generating unit;
  a flexible heat-transfer member provided between said heat generating unit and said heat receiving portion, for thermally connecting said heat generating unit and said heat receiving portion; and
  a spacer provided between said base of said circuit component and said heat sink, for supporting said heat sink.

2. An apparatus according to claim 1, wherein said plurality of terminals protrude from said second mounting surface of said base toward said socket.

3. An apparatus according to claim 1, wherein said socket is sandwiched between said wiring board and said base of said circuit component to support said base.

4. An apparatus according to claim 1, wherein said heat generating unit has a plurality of connection terminals, each of which are electrically connected to said base.

5. An apparatus according to claim 1, wherein said spacer faces said socket through said base disposed therebetween.

6. An apparatus according to claim 1, wherein said second mounting surface has a first arrangement region and a second arrangement region surrounded by said first arrangement region, and said second arrangement region faces the hollow portion of said socket.

7. An apparatus according to claim 1, further comprising at least one other circuit component mounted on said second mounting surface, said other circuit component being contained in the hollow portion of said socket.

8. An electronic apparatus comprising:
  a housing;
  a wiring board contained inside said housing, said wiring board having a surface; a circuit component containing a base, said base having a first mounting surface, a second mounting surface positioned on an opposite side to the first mounting surface, a plurality of terminals arranged on said second mounting surface, and a heat generating unit positioned on a center part of the first mounting surface of said base, said plurality of terminals being arranged in an area around said heat generating unit;
  a socket provided on the surface of said wiring board and electrically connected to said plurality of terminals, said socket having a hollow portion at a position corresponding to the central part of said base, said second mounting surface of said base facing the hollow portion of said socket;
  a heat sink on said circuit component, said heat sink having a heat receiving portion for receiving heat from said heat generating unit;
  a flexible heat-transfer member provided between said heat generating unit and said heat receiving portion, for thermally connecting said heat generating unit and said heat receiving portion to one another;
  a pushing member for pushing said heat sink toward said heat generating unit to sandwich said heat-transfer member between said heat generating unit and said heat receiving portion; and
  a spacer provided between said base of said circuit component and said heat sink, for supporting said heat sink.

9. An electronic apparatus according to claim 8, wherein said plurality of terminals protrude from said second mounting surface of said base toward said socket.

10. An electronic apparatus according to claim 8, wherein said socket is sandwiched between said wiring board and said base of said circuit component to support said base.

* * * * *